US012025639B2

(12) United States Patent
Brehm

(10) Patent No.: US 12,025,639 B2
(45) Date of Patent: Jul. 2, 2024

(54) MULTIMETER WITH A METER PROBE MODULE AND PHASING PROBE MODULE CAPABLE OF WIRELESS COMMUNICATION AND PROXIMITY MEASUREMENTS

(71) Applicant: STB Electrical Test Equipment, Inc., Auburn, CA (US)

(72) Inventor: Gary Brehm, Auburn, CA (US)

(73) Assignee: STB Electrical Test Equipment, Inc., Auburn, CA (US)

( * ) Notice: Subject to any disclaimer, the term of this patent is extended or adjusted under 35 U.S.C. 154(b) by 0 days.

(21) Appl. No.: 18/200,494

(22) Filed: May 22, 2023

(65) Prior Publication Data

US 2023/0296647 A1    Sep. 21, 2023

Related U.S. Application Data

(63) Continuation of application No. 17/508,345, filed on Oct. 22, 2021, now Pat. No. 11,693,032, which is a continuation of application No. 16/373,222, filed on Apr. 2, 2019, now Pat. No. 11,175,314.

(60) Provisional application No. 62/654,232, filed on Apr. 6, 2018.

(51) Int. Cl.
*G01R 15/12* (2006.01)
*G01R 13/40* (2006.01)
*G08B 5/36* (2006.01)

(52) U.S. Cl.
CPC ......... *G01R 15/125* (2013.01); *G01R 13/402* (2013.01); *G08B 5/36* (2013.01)

(58) Field of Classification Search
CPC ... G01R 13/402; G01R 15/125; G01R 25/005
See application file for complete search history.

(56) References Cited

U.S. PATENT DOCUMENTS

| 4,045,044 | A | 8/1977 | Bierer |
|---|---|---|---|
| 5,950,954 | A | 9/1999 | Bierer |
| 6,275,022 | B1 | 8/2001 | Bierer |
| 6,459,252 | B1 | 10/2002 | Bierer |
| 6,617,840 | B2 | 9/2003 | Bierer |
| 6,734,658 | B1 | 5/2004 | Bierer |

(Continued)

*Primary Examiner* — Jermele M Hollington
*Assistant Examiner* — Temilade S Rhodes-Vivour
(74) *Attorney, Agent, or Firm* — Jafari Law Group, Inc.

(57) ABSTRACT

The invention involves a multimeter with a meter probe module and phasing probe module capable of wireless communication, proximity measurements, and accurately reading phase degrees. The meter probe module and the phasing probe module can communicate wirelessly, via a wired cable interface, or any combination thereof. The meter probe module and phasing probe module have unique radio frequency serial numbers that allow the probe modules to only communicate with its paired partner probe module while ignoring all other probe modules. The multimeter has a measurement point capable of taking direct contact measurements. The multimeter also has a measurement point capable of taking a voltage measurement without directly contacting the object to be measured. This is accomplished by taking voltage readings from the electric field of the air surrounding said object. The improved multimeter may allow an operator to more safely gather accurate information about an object being measured.

17 Claims, 11 Drawing Sheets

(56) References Cited

U.S. PATENT DOCUMENTS

| | | |
|---|---|---|
| 6,753,678 B2 | 6/2004 | Bierer |
| 7,059,769 B1 * | 6/2006 | Potega .................... B60L 58/25 |
| | | 374/185 |
| 7,109,699 B1 | 9/2006 | Bierer |
| 7,808,228 B1 | 10/2010 | Bierer |
| 8,283,910 B1 | 10/2012 | Bierer |
| 8,283,911 B1 | 10/2012 | Bierer |
| 8,760,150 B1 | 7/2014 | Bierer |
| 8,970,204 B1 | 3/2015 | Bierer |
| 9,766,270 B2 | 9/2017 | Heydron |
| 10,120,021 B1 * | 11/2018 | Silva ...................... G01R 21/02 |
| 2002/0093326 A1 | 7/2002 | Bierer |
| 2002/0135353 A1 | 9/2002 | Bierer |
| 2003/0037295 A1 | 4/2003 | Bierer |
| 2013/0158907 A1 * | 6/2013 | Guo ................... G01R 19/2513 |
| | | 702/60 |
| 2013/0236007 A1 * | 9/2013 | Munro ................. H04L 9/0861 |
| | | 380/44 |
| 2015/0022171 A1 | 1/2015 | Chen et al. |
| 2015/0022181 A1 | 1/2015 | Anderson |
| 2016/0076943 A1 | 3/2016 | Bohn et al. |
| 2016/0080666 A1 | 3/2016 | Stuart et al. |
| 2017/0086281 A1 | 3/2017 | Avrahamy |
| 2018/0136302 A1 | 5/2018 | Epperson |
| 2018/0136303 A1 | 5/2018 | Epperson |
| 2018/0180648 A1 | 6/2018 | Carson |
| 2018/0238955 A1 * | 8/2018 | Bango .................... G08B 21/02 |
| 2019/0072632 A1 | 3/2019 | Huber |
| 2019/0160646 A1 | 5/2019 | Hoossainy |

* cited by examiner

MULTIMETER WITH A METER PROBE MODULE AND PHASING PROBE MODULE CAPABLE OF WIRELESS COMMUNICATION AND PROXIMITY MEASUREMENTS

PRIORITY NOTICE

The present application is a continuation of U.S. application Ser. No. 17/508,345, filed on Oct. 22, 2021, which is a continuation of U.S. application Ser. No. 16/373,222, filed on Apr. 2, 2019, U.S. Pat. No. 11,175,314, issued on Nov. 16, 2021, which claims priority under 35 U.S.C. § 119(e) to U.S. Provisional Patent Application Ser. No. 62/654,232, filed Apr. 6, 2018, all of which are incorporated by reference herein in their entirety for all purposes.

TECHNICAL FIELD OF THE INVENTION

The present invention relates generally to multimeters, and more specifically, to an improved multimeter comprised of a meter probe module and a phasing probe module that can communicate wirelessly or via a wired cable interface and which can take measurements by being in proximity to the object to be measured to safely and accurately display differential measurements. The improved multimeter disclosed herein allows an operator to safely operate in all potential situations.

COPYRIGHT AND TRADEMARK NOTICE

A portion of the disclosure of this patent application may contain material that is subject to copyright protection. The owner has no objection to the facsimile reproduction by anyone of the patent document or the patent disclosure, as it appears in the Patent and Trademark Office patent file or records, but otherwise reserves all copyrights whatsoever. Certain marks referenced herein may be common law or registered trademarks of third parties affiliated or unaffiliated with the applicant or the assignee. Use of these marks is by way of example and should not be construed as descriptive or to limit the scope of this invention to material associated only with such marks.

BACKGROUND OF THE INVENTION

Multimeters, sometimes referred to as multitesters, have existed since the early 1920s. In fact, the prior art is rife with disclosures discussing variations on these measurement devices. Multimeters can be used to measure a vast number of quantities, including voltage, current, resistance, capacitance, conductance, and frequency, to name but a few. Multimeters have proven useful in, among other places, laboratories and physics classrooms lecturing on electricity. Multimeters also aid those whose job duties include servicing, maintaining, and/or operating electrical power transmission and distribution centers. Such professionals use multimeters to determine, among other things, when an area pulsing with heart-stopping electricity is safe for servicing, maintaining, and/or operating. Without multimeters, these workers may come in contact with a cable they believe to be dead but is actually charged and carrying hundreds of thousands of volts of deadly and powerful electricity.

The prior art, however, has several shortcomings. One problem is that the various probes of previous multimeters only function properly if they are hardwired together via a cable interface. Having the probes communicate to each other via a cable interface only may introduce unnecessary hazards to the operator. For example, there may be interference with the cable interface that results in the probes not providing an accurate reading or the cable interface may not be fully plugged in to one or both of the probes of which the operator is not aware. Such scenarios can result in a false "safe condition" designation from the multimeter that, if the operator relies on the multimeter to be accurate, can result in injury or death to the operator and those nearby.

Another shortcoming of the prior art is that the prior art merely assumes phase degrees. A phase is the difference, expressed in degrees of time, between two waves having the same frequency and referenced to the same point in time.

Yet another shortcoming in the prior art is the inability to take measurements by both direct contact and by proximity without any contact between the probe and the object to be measured.

Accordingly, there is an unanticipated or inadequately addressed need for an improved multimeter whose meter probe module and phasing probe module primarily communicate wirelessly but may communicate via a wired cable interface if the situation is inappropriate for wireless communication. Further, there is a need for a multimeter that accurately displays phase degrees. Additionally, there is a need for a multimeter capable of taking measurements by both direct contact and by proximity without there being contact between the probe module and the object to be measured.

Therefore, there is a need for a new and improved multimeter that allows those people dealing with electricity to perform their duties and/or tasks with increased safety and assuredness. It is to these ends that the present invention has been developed.

SUMMARY OF THE INVENTION

To minimize the limitations in the prior art, and to minimize other limitations that will be apparent upon reading and understanding the present specification, the present invention describes a multimeter with a meter probe module and a phasing probe module useful for measuring electrical quantities.

Generally, the invention involves a multimeter comprised of a meter probe module and a phasing probe module. In accordance with some embodiments of the present invention, the multimeter may be capable of measuring in several different modes. Different measurement modes may be useful to an operator depending on what quantities they wish to measure. Crucially, each of the probes can only establish a wireless communication after being paired through a wired means. As such, in exemplary embodiments, a microcontroller of the meter probe and a microcontroller of the phasing probe are configured to execute a wired pairing protocol that establishes an exclusive communication between the meter probe module and the phasing probe module. Once paired, the meter probe module and the phasing probe module are configured to communicate wirelessly.

A multimeter, in accordance with some exemplary embodiments of the present invention, may comprise: a first module including a first enclosure housing: a first wireless communication interface, a first wired communication interface, a first measurement point, a second measurement point, and a first microcontroller configured to generate a first electrical signal from a first electrical quantity measured via the first measurement point or the second measurement point; and a second module including a second enclosure housing: a second wireless communication interface, a second wired communication interface, a third measurement point, and a second microcontroller configured to generate a second electrical signal from a second electrical quantity measured via the third measurement point, wherein: the first microcontroller and the second microcontroller are configured to execute a wired pairing protocol that establishes an exclusive communication between the first module and the second module; the first microcontroller and the second microcontroller are configured to communicate wirelessly after establishing the exclusive communication; the first microcontroller is configured to receive the second electrical signal from the second microcontroller to determine a first electrical parameter; and a display controller of the first module is configured to generate an output associated with the first electrical parameter.

A meter probe module, in accordance with some exemplary embodiments of the present invention, may comprise: a wired communication interface configured to establish an exclusive communication protocol with a phasing probe module; a wireless communication interface configured to wirelessly facilitate the exclusive communication protocol with the phasing probe module; a first measurement point configured to generate a first electrical signal indicative of a first electrical quantity; a second measurement point configured to generate a second electrical signal indicative of a second electrical quantity; and a microcontroller configured to: receive the first electrical signal and determine a first electrical parameter; receive the second electrical signal and determine a second electrical parameter, wherein the first and second electrical parameters is selected from the group consisting of a voltage measurement; a current measurement; and a phase measurement; and receive a third electrical signal from the phasing probe module and determine a differential measurement, wherein the differential measurement is selected from the group consisting of: a voltage differential; a current differential; and a phase differential.

A phasing probe module, in accordance with some exemplary embodiments of the present invention, may comprise: a wired communication interface configured to establish an exclusive communication protocol with a meter probe module; a wireless communication interface configured to wirelessly facilitate the exclusive communication protocol with the meter probe module; a measurement point configured to generate an electrical signal indicative of an electrical quantity; and a microcontroller configured to: receive the electrical signal and determine an electrical parameter; and send the electrical parameter to the meter probe module, wherein the electrical parameter is selected from the group consisting of a voltage measurement; a current measurement; and a phase measurement.

Various objects and advantages of the present invention will become apparent from the following description taken in conjunction with the accompanying drawings wherein are set forth, by way of illustration and example, certain embodiments of this invention. The drawings submitted herewith constitute a part of this specification, include exemplary embodiments of the present invention, and illustrate various objects and features thereof.

BRIEF DESCRIPTION OF THE DRAWINGS

Elements in the figures have not necessarily been drawn to scale in order to enhance their clarity and improve understanding of the various embodiments of the invention. Furthermore, elements that are known to be common and well understood to those in the industry are not depicted in order to provide a clear view of the various embodiments of the invention. The drawings that accompany the detailed description can be briefly described as follows.

DETAILED DESCRIPTION OF THE INVENTION

Figure 1:
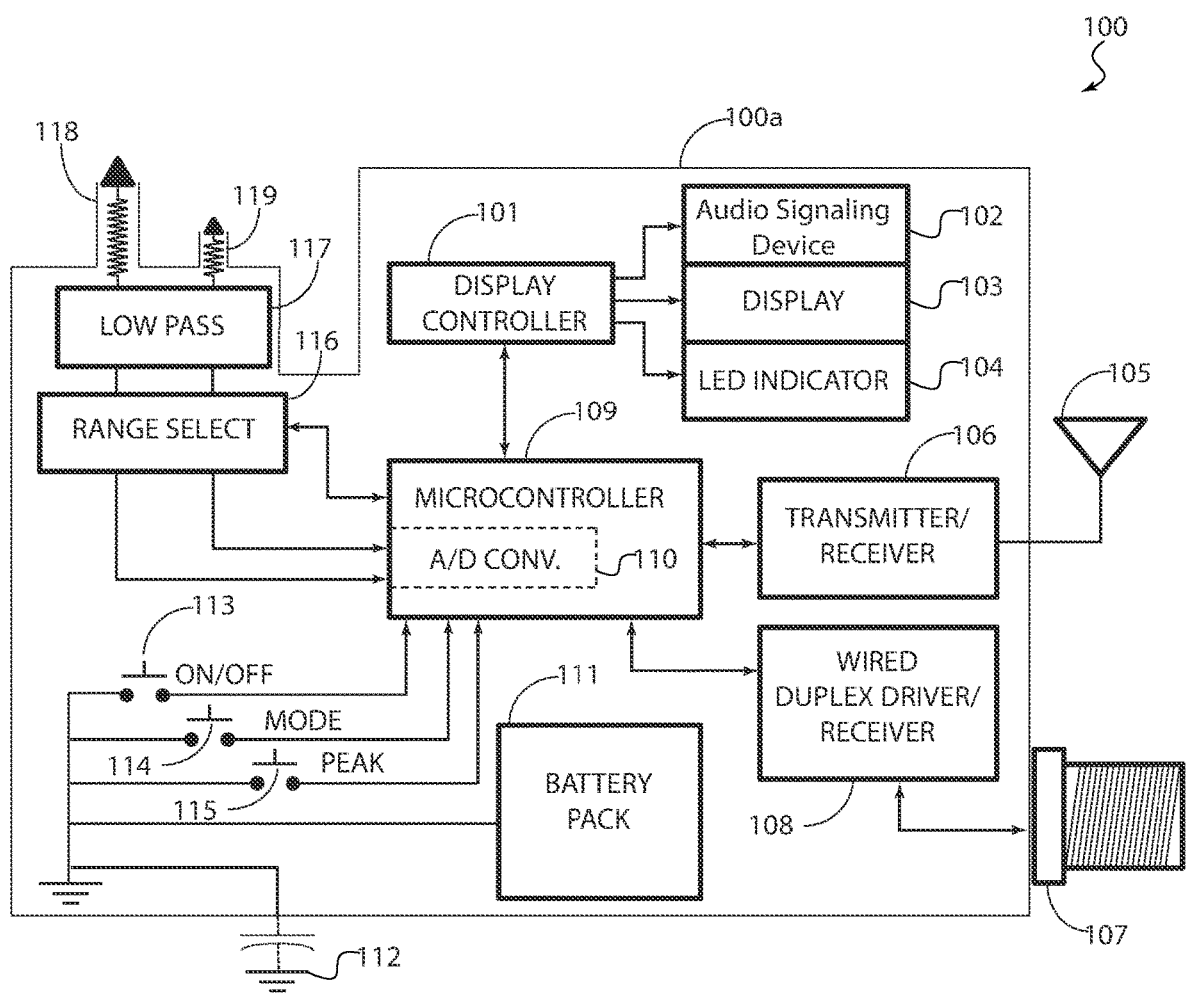
FIG. 1 illustrates a block diagram of a meter probe module.

In the following discussion that addresses a number of embodiments and applications of the present invention, reference is made to the accompanying figures, which form a part thereof. Depictions are made, by way of illustration, of specific embodiments in which the invention may be practiced; however, it is to be understood that other embodiments may be utilized and changes may be made without departing from the scope of the present invention. Whenever possible, the same reference numbers are used in the drawings and the following description to refer to the same or similar elements.

In the following detailed description, numerous specific details are set forth by way of examples in order to provide a thorough understanding of the relevant teachings. However, it should be apparent to those skilled in the art that the present teachings may be practiced without such details. In other instances, well-known structures, components, and/or functional or structural relationship thereof, etc., have been described at a relatively high level, without detail, in order to avoid unnecessarily obscuring aspects of the present teachings.

Throughout the specification and claims, terms may have nuanced meanings suggested or implied in context beyond an explicitly stated meaning. Likewise, the phrase "in one embodiment/example" as used herein does not necessarily refer to a different embodiment. It is intended, for example, that claimed subject matter include combinations of example embodiments in whole or in part.

Conditional language used here, such as, among others, "can," "could," "might," "may, "e.g.," and the like, unless specifically stated otherwise, or otherwise understood within the context as used, is generally intended to convey that certain embodiments include, while other embodiments do not include, certain features, elements, and/or steps. Thus, such conditional language is not generally intended to imply that features, elements, and/or steps are in any way required for one or more embodiments, whether these features, elements, and/or steps are included or are to be performed in any particular embodiment.

The terms "comprising," "including," "having," and the like are synonymous and are used inclusively, in an open-ended fashion, and do not exclude additional elements, features, acts, operations, and so forth. Also, the term "or" is used in its inclusive sense (and not in its exclusive sense) so that when used, for example, to connect a list of elements, the term "or" means one, some, or all of the elements in the list. Conjunctive language such as the phrase "at least one of X, Y, and Z," unless specifically stated otherwise, is otherwise understood with the context as used in general to convey that an item, term, etc. may be either X, Y, or Z. Thus, such conjunctive language is not generally intended to imply that certain embodiments require at least one of X, at least one of Y, and at least one of Z to each be present. The term "and/or" means that "and" applies to some embodiments and "or" applies to some embodiments. Thus, A, B, and/or C can be replaced with A, B, and C written in one sentence and A, B, or C written in another sentence. A, B, and/or C means that some embodiments can include A and B, some embodiments can include A and C, some embodiments can include B and C, some embodiments can only include A, some embodiments can include only B, some embodiments can include only C, and some embodiments include A, B, and C. The term "and/or" is used to avoid unnecessary redundancy. Similarly, terms such as "a," "an," or "the," again, may be understood to convey a singular usage or to convey a plural usage, depending at least in part upon context. In addition, the term "based on" may be understood as not necessarily intended to convey an exclusive set of factors and may, instead, allow for the existence of additional factors not necessarily expressly described, again, depending at least in part on context.

While exemplary embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Thus, nothing in the foregoing description is intended to imply that any particular feature, characteristic, step, module, or block is necessary or indispensable. Indeed, the novel methods and systems described herein may be embodied in a variety of other forms; furthermore, various omissions, substitutions, and changes in the form of the methods and systems described herein may be made without departing from the spirit of the invention or inventions described herein. Accordingly, the following detailed description does not limit the disclosure. Instead, the proper scope of the disclosure is defined by the appended claims.

The present disclosure relates to, among other things, an apparatus for measuring and displaying electrical quantities. Exemplary embodiments of the present disclosure are described with reference to the drawings for illustration purposes and are not intended to limit the scope of the present disclosure.

Turning now to the figures, FIG. 1 illustrates a block diagram of a meter probe module 100. More specifically, FIG. 1 depicts a meter probe module 100 which may comprise a display controller 101, a buzzer 102, a numeric display 103, a plurality of LED indicators 104, an antenna 105, a wireless RF transmitter/receiver 106, a wired interconnect port 107, a wired duplex driver/receiver 108, a microcontroller 109, an analog to digital converter 110, a battery pack 111, an earth ground 112, a plurality of buttons (an on/off button 113, a measurement mode button 114, and a peak measurement button 115), a range select 116, a low pass filter 117, and a plurality of measurement points (a first measurement point 118 and a second measurement point 119).

The display controller 101 may be connected to and in communication with the buzzer 102, the numeric display 103, the plurality of LED indicators 104, and the microcontroller 109. The display controller 101 may control when to activate and deactivate the buzzer 102, the numeric display 103, and the plurality of LED indicators 104. The buzzer 102 may be activated to make noises in the presence of voltage. The buzzer 102 may be auditory, vibrational, or any other indication system suitable for providing notifications to an operator, such as and without limitation, a Piezo buzzer. The numeric display 103 may be any display system known in the art. The numeric display 103 may display the value of the quantity being measured. It is envisioned in some embodiments that numbers greater than or equal 10,000 may be displayed with a multiplier. For example, and without limiting the scope of the present invention, a multimeter reading of 75,000 volts may be displayed as "75K."

The plurality of LED indicators 104 may include several LEDs that, via the display controller 101, may be turned on and off depending on various situations. For example, and without limitation, the plurality of LED indicators 104 may include a lethal voltage LED, an on/off LED, a battery low LED, an RF interface communication health LED, and a mode LED for each measurement mode the operator may be using. It is envisioned that the plurality of LED indicators 104 may provide indications to the operator by, without limitation, flashing on and off, remaining solid, changing colors, or any combination thereof. For example, the on/off LED may turn and remain green upon a successful powering on, the battery low LED may flash red to indicate that the battery pack 111 needs to be changed, and the RF interface communication health LED may turn one color to indicate good communication health and another color to indicate poor communication health. Other methods of providing notices to an operator via LEDs may be implemented without deviating from the spirit of the present invention.

Different measurement modes may be useful to the operator depending on what quantities they wish to measure. As such, the multimeter has a plurality of modes the operator may select in order to obtain accurate measurements. For example, and without limiting the scope of the present invention, Mode 1 may be a voltage, single probe, direct contact mode; Mode 2 may be a phasing voltage, direct contact mode; Mode 3 may be a voltage, single probe, capacitive mode; Mode 4 may be a phasing voltage, capacitive mode; Mode 5 may be a voltage, single probe, non-contact mode; Mode 6 may be a current, single probe non-contact mode; and Mode 7 may be a phasing degrees, direct contact mode.

In exemplary embodiments, meter probe 100 may be configured to operate Modes 1, 3, 5, and 6 without connecting to a phasing probe 200. This may be because, in some embodiments, Modes 1, 3, 5, and 6 may be directed to single probe measurements, thus negating the need for the phasing probe for that particular measurement. This list of modes is not meant to be exhaustive as other modes suitable for taking measurements are contemplated by the present invention.

It is envisioned in an exemplary embodiment of the present invention that the meter probe module 100 may communicate with the phasing probe module 200 via a wireless interconnect. To accomplish this wireless communication, the antenna 105 may be connected to the wireless RF transmitter/receiver 106 which itself is connected to the microcontroller 109. It is contemplated by the present invention that the meter probe module 100 and the phasing probe module 200 may have unique RF serial numbers. The unique RF serial numbers may allow the two probe modules to be paired to each other and only to each other. The antenna 105 may be any antenna suitable for wirelessly communicating with a wireless RF transmitter/receiver. The wireless RF transmitter/receiver 106 may be any wireless RF transmitter/receiver known in the art.

It is further envisioned in an exemplary embodiment of the present invention that the meter probe module 100 may communicate with the phasing probe module 200 via a wired interconnect. For example, and without limiting the scope of the present invention, if, on powering up, the meter probe module 100 has never communicated with a phasing probe module, the meter probe module may be incapable of communicating with any phasing probe modules wirelessly until the operator connects the two probe modules together through the wired interface temporarily. Doing so exclusively pairs the meter probe module 100 to the phasing probe module 200, and the meter probe module 100 and the phasing probe module 200 will only talk to each other while ignoring all other probe modules. To connect the meter probe module 100 to the phasing probe module 200 via a wired cable, the operator inserts a connection cable into the wired interconnect port 107 of the meter probe module and a wired interconnect port 205 of the phasing probe module 200 (see FIG. 2). The wired interconnect port 107 may be connected to and in communication with the wired duplex driver/receiver 108. The wired duplex driver/receiver 108 may be any wired duplex driver/receiver known in the art. The wired duplex driver/receiver 108 may be connected to and in communication with the microcontroller 109.

The microcontroller 109 may be programmed to control and coordinate the other components of the meter probe module 100. The microcontroller 109 may be any microcontroller known in the art. The microcontroller 109 may be connected to and in communication with wireless RF transmitter/receiver 106, the display controller 101, the wired duplex driver/receiver 108, the battery pack 111, the plurality of buttons 113-115, and the range select 116. The microcontroller 109 may have an analog to digital converter 110. The analog to digital converter 110 may be used to convert an analog voltage or current into a digital value representing the magnitude of the voltage or current. The analog to digital converter 110 may be any analog to digital converter suitable for converting an analog signal into a digital signal.

In some embodiments of the present invention, the meter probe module 100 may be powered by a battery pack 111. The battery pack 111 may use CR 123A batteries. It is also envisioned that the meter probe module 100 can function on batteries capable of being recharged outside of the unit. The battery pack 100 may be connected to and in communication with the microcontroller 109. Of course, other batteries may be implemented without deviating from the spirit of the present invention.

The meter probe module 100 may have an earth ground 112. The earth ground 112 may define a point in a circuit as a reference point with a voltage of 0 volts. The earth ground 112 may be connected to the microcontroller 109 and may be any means known in the art for accurately measuring a reference point in an electrical circuit from which voltages are measured.

It is envisioned in some embodiments of the present invention that an operator may operate the meter probe module 100, in part, via a plurality of buttons. In an exemplary embodiment, the meter probe module 100 may have three buttons: an on/off button 113, a measurement mode button 114, and a peak measurement button 115. The plurality of buttons may be connected to the microcontroller 109. The on/off button 113 may be used to turn the meter probe module 100 on and off. The measurement mode button 114 may be used to cycle between the meter probe module's various modes so an operator can work in the proper mode. The peak measurement button 115 may be used to display a current peak measurement value and to set a new peak measurement value. Some embodiments of the present invention may include fewer or more buttons assigned to different tasks.

In some embodiments of the present invention, the meter probe module 100 may have a range select 116 that may allow the meter probe module 100 to automatically adjust itself to provide the most accurate information for the conditions being measured by the first measurement point 118 and/or the second measurement point 119. The range select 116 may be connected to the microcontroller 109 and the low pass filter 117.

In another embodiment of the present invention, the meter probe module 100 may utilize a low pass filter 117 to modify, reshape, or reject unwanted frequencies and accept and pass on desired frequencies. The low pass filter 117 may be connected to the first measurement point 118 and/or the second measurement point 119 and the range select 116. The low pass filter 117 may be any means suitable for modifying, reshaping, rejecting, and accepting frequencies from an electrical quantity.

In some embodiments of the present invention, the meter probe module 100 may have a plurality of measurement points protruding from a surface of the meter probe module 100. For example, and without limiting the scope of the present invention, there may be a first measurement point 118 and a second measurement point 119. Of course, a greater or fewer number of measurement points may be utilized without deviating from the scope and spirit of the present invention. The first measurement point 118 may be used to measure quantities by being in direct contact with the object to be measured, and the second measurement point 119 may be used to measure quantities by being in proximity to the object to be measured. The first measurement point 118 and the second measurement point 119 may be comprised of resistors. It is envisioned that the first measurement point 118 and the second measurement point 119 may be standard probes, such as but not limited to, alligator clips, test probes, and test leads. The first measurement point 118 and the second measurement point 119 may be connected to and in communication with the low pass filter 117.

In regard to the second measurement point 119, it is envisioned in some embodiments of the present invention that the second measurement point 119 may take measurements by being proximity to the object to be measured as opposed to being in direct contact with said object. The second measurement point 119 may accomplish this proximity reading by reading the voltage of the electric field of the air surrounding the object to be measured.

In one embodiment of the present invention, the meter probe module 100 may be operated by first turning the meter probe module 100 on via the on/off button 113. The operator may then connect the meter probe module 100 to the phasing probe module 200 via the wireless interconnect or the wired interconnect. The operator may then use the first measurement point 118 and/or the second measurement point 119 to measure an electrical quantity. The information from the first measurement point 118 and/or the second measurement point 119 may then go through the low pass filter 117. The first measurement point 118 and the second measurement point 119 may each have its own path through the low pass filter 117 leading to a different portion of the analog to digital converter 110. After being filtered by the low pass filter 117, the information may go through the range select 116. The information may then be sent to the microcontroller 109 and the analog to digital converter 110. The microcontroller 109 may then process the received information, and the analog to digital converter 110 may convert the analog signal to a digital signal. The microcontroller 109 may then adjust the range select 116 to give the most accurate measurement for the conditions. The digital signal may then be sent to the display controller 101. The display controller 101 may then display the information via the numeric display 103, and, depending on the information, may also activate the buzzer 102 and/or one or several of the plurality of LED indicators 104.

Figure 2:
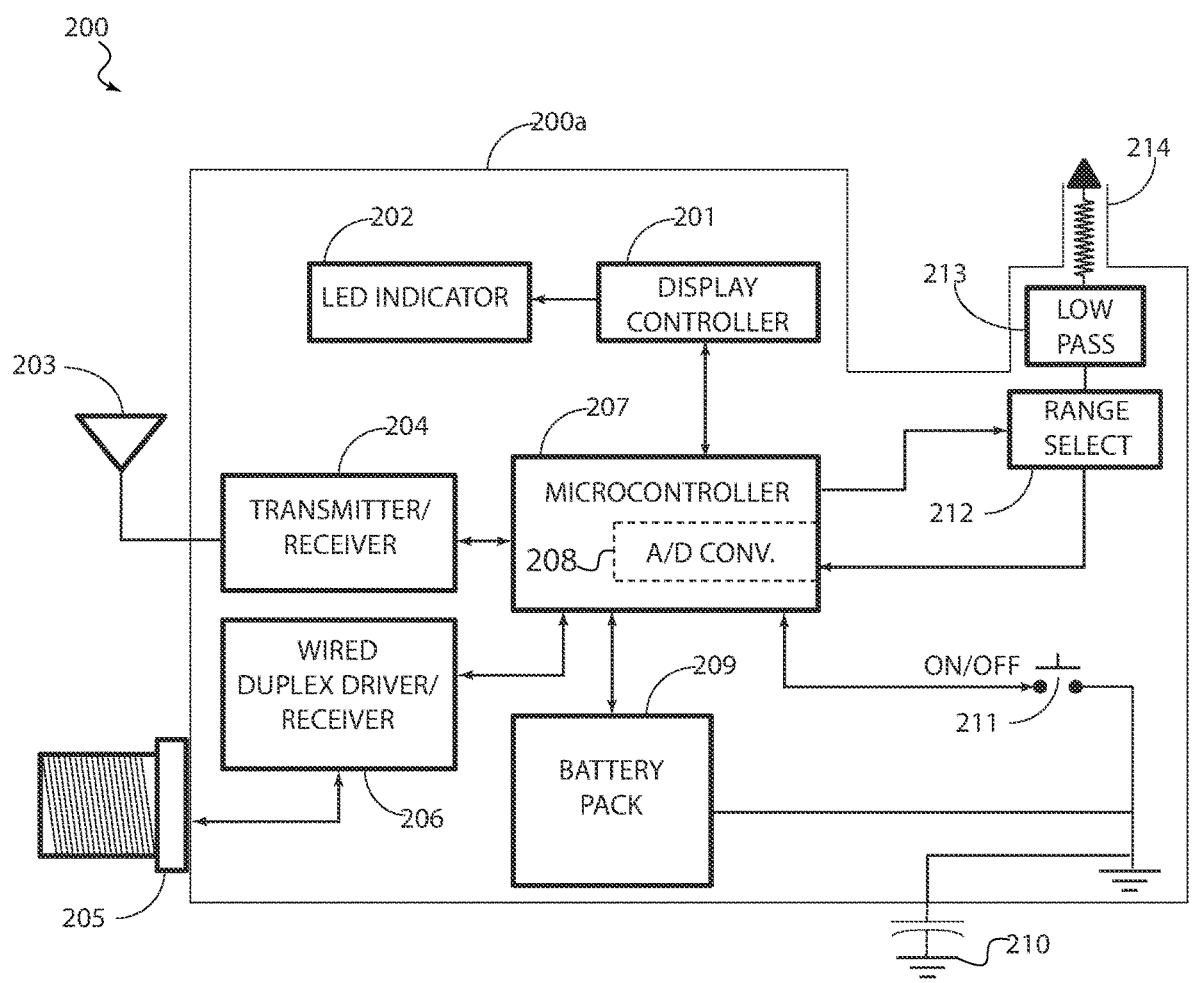
FIG. 2 illustrates a block diagram of a phasing probe module.

Turning now to FIG. 2, a block diagram of a phasing probe module 200 is depicted. More specifically, FIG. 2 depicts a phasing probe module 200 which may provide a reference from which the meter probe module 100 may measure differentials. The phasing probe module 200 may comprise a display controller 201, a plurality of LED indicators 202, an antenna 203, a wireless RF transmitter/receiver 204, a wired interconnect port 205, a wired duplex driver/receiver 206, a microcontroller 207, an analog to digital converter 208, a battery pack 209, an earth ground 210, an on/off button 211, a range select 212, a low pass filter 213, and a first measurement point 214.

The display controller 201 may be connected to and in communication with the plurality of LED indicators 202 and the microcontroller 207. The display controller 201 may control when to activate and deactivate the plurality of LED indicators 202. The plurality of LED indicators 202 may include several LEDs that, via the display controller 201 and the microcontroller 207, may be turned on and off depending on various situations. For example, and without limitation, the plurality of LED indicators 202 may include a lethal voltage LED, an on/off LED, and an RF interface communication health LED.

The plurality of LED indicators 202 may include several LEDs that, via the display controller 201 and the microcontroller 207, may be turned on and off depending on the situation. It is envisioned that the plurality of LED indicators 202 may provide indications to the operator by, without limitation, flashing on and off, remaining solid, changing colors, or any combination thereof. By way of example only, the on/off LED may turn and remain green upon a successful powering on, the battery low LED may flash red to indicate that the battery pack 209 needs to be changed, and the RF interface communication health LED may turn one color to indicate good communication health and another color to indicate poor communication health. It is also envisioned, for example, that the RF interface communication health LED may actually be two LEDs: one that may blink red to indicate that the RF communication is not healthy, and a second that may remain green to indicate that the RF communication is healthy. Other methods suitable for providing notices to an operator via LEDs may be implemented without deviating from the spirit of the present invention.

Different measurement modes may be useful to the operator depending on what quantities they wish to measure. As such, the multimeter has a plurality of modes the operator may select in order to obtain accurate measurements. For example and without limitation, Mode 1 may be a voltage, single probe, direct contact mode; Mode 2 may be a phasing voltage, direct contact mode; Mode 3 may be a voltage, single probe, capacitive mode; Mode 4 may be a phasing voltage, capacitive mode; Mode 5 may be a voltage, single probe, non-contact mode; Mode 6 may be a current, single probe non-contact mode; and Mode 7 may be a phasing degrees, direct contact mode. The phasing probe module 200 may not be implemented by an operator taking measurements with Modes 1, 3, 5, and 6 because those modes may be directed to single probe measurements via the meter probe module 100. This list of modes is not meant to be exhaustive as other modes suitable for obtaining measurements are contemplated by the present invention.

It is envisioned in an exemplary embodiment of the present invention that the phasing probe module 200 may communicate with the meter probe module 100 via a wireless interconnect. To accomplish this wireless communication, the antenna 203 may be connected to the wireless RF transmitter/receiver 204 which itself is connected to the microcontroller 207. It is contemplated by the present invention that the phasing probe module 200 and the meter probe module 100 may have unique RF serial numbers. The unique RF serial numbers may allow the two probe modules to be married to each other, and only to each other. The antenna 203 may be any antenna suitable for wirelessly communicating with a wireless RF transmitter/receiver. It is contemplated that the wireless RF transmitter/receiver 204 may be any wireless RF transmitter/receiver known in the art.

It another exemplary embodiment of the present invention, the phasing probe module 200 may communicate with the meter probe module 100 via a wired interconnect. It is envisioned that the phasing probe module 200 may communicate with the meter probe module 100 only wirelessly, only wired, or any combination thereof. For example, and without limitation, if, on powering up, the phasing probe module 200 has never communicated with a meter probe module, the phasing probe module may be incapable of communicating with any meter probe modules wirelessly until the operator temporarily connects the two probe modules together through the wired interface. Doing so exclusively pairs the phasing probe module 200 to the meter probe module 100, and the phasing probe module 200 and the meter probe module 100 will only talk to each other while ignoring all other probe modules. To connect the phasing probe module 200 to the meter probe module 100 via a wired cable, the operator inserts a connection cable into the wired interconnect port 205 of the phasing probe module 200 and the wired interconnect port 107 of the meter probe module 100 (see FIG. 1). The wired interconnect port 205 may be connected to and in communication with the wired duplex driver/receiver 206. The wired duplex driver/receiver 206 may be any wired duplex driver/receiver known in the art. The wired duplex driver/receiver 206 may be connected to and in communication with the microcontroller 207.

The microcontroller 207 may be programmed to control and coordinate the other components of the phasing probe module 200. The microcontroller 207 may be any microcontroller known in the art. The microcontroller 207 may be connected to and in communication with all other components of the phasing probe module 200, including but not limited to, the wireless RF transmitter/receiver 204, the display controller 201, the wired duplex driver/receiver 206, the battery pack 209, the on/off button 211, and the range select 212. The microcontroller 207 may have an analog to digital converter 208. The analog to digital converter 208 may be used to convert an analog voltage or current into a digital number representing the magnitude of the voltage or current. The analog to digital converter 208 may be any analog to digital converter suitable for converting an analog signal into a digital signal.

In some embodiments of the present invention, the phasing probe module 200 may be powered by a battery pack 209. The battery pack 209 may use CR 123A batteries to power the phasing probe module 200. It is also envisioned that the phasing probe module 200 can function on batteries capable of being recharged outside of the unit. The battery pack 209 may be connected to and in communication with the microcontroller 207. Of course, other batteries are contemplated and may be used by the phasing probe module 200 without deviating from the spirit of the present invention.

The phasing probe module 200 may have an earth ground 210. The earth ground 210 may define a point in a circuit as a reference point with a voltage of 0 volts. The earth ground 210 may be connected to the microcontroller 207, and may be any means known in the art for accurately measuring a reference point in an electrical circuit from which voltages are measured.

It is envisioned in some embodiments of the present invention that an operator may turn the phasing probe module 200 on and off via an on/off button 211 which may be connected to the microcontroller 207. While an exemplary embodiment of the present invention may have only the on/off button 211, the phasing probe module 200 may be comprised of a plurality of buttons.

In some embodiments of the present invention, the phasing probe module 200 may have a range select 212 that may allow the phasing probe module 200 to automatically adjust itself to provide the most accurate information for the conditions being measured by the first measurement point 214. The range select 212 may be connected to and in communication with the microcontroller 207 and the low pass filter 213.

In another embodiment of the present invention, the phasing probe module 200 may utilize a low pass filter 213 to modify, reshape, or reject unwanted frequencies and accept and pass on only desired frequencies. The low pass filter 213 may be connected to the first measurement point 214 and the range select 212. The low pass filter 213 may be any means suitable for modifying, reshaping, rejecting, and accepting frequencies from an electrical quantity.

In some embodiments of the present invention, the phasing probe module 200 may have a first measurement point 214 protruding from a surface of the phasing probe module 200. Of course, a greater or fewer number of measurement points may be utilized without deviating from the scope and spirit of the present invention. The first measurement point 214 may be used to measure quantities of the object to be measured. The first measurement point 214 may be comprised of a resistor to help provide accurate measurements to the operator. It is envisioned that the first measurement point 214 may be a standard probe, such as but not limited to, alligator clips, test probes, and test leads. The first measurement point 214 may be connected to and in communication with the low pass filter 213.

In an embodiment of the present invention, the phasing probe module 200 may be operated by first turning the phasing probe module 200 on via the on/off button 211. The operator may then connect the phasing probe module 200 to the meter probe module 100 via the wireless interconnect or the wired interconnect. The operator may then use the first measurement point 214 to measure an electrical quantity. The information from the first measurement point 214 may then go through the low pass filter 213. The first measurement point 214 may have a path through the low pass filter 213 that leads to the analog to digital converter 208. After being filtered by the low pass filter 213, the information may go through the range select 212. The information may then be sent to the microcontroller 207 and the analog to digital converter 208. The microcontroller 207 may then process the received information, and the analog to digital converter 208 may convert the analog signal to a digital signal. The microcontroller 207 may then adjust the range select 212 to give the most accurate measurement for the conditions. The digital signal may then be sent to the display controller 201. The display controller 201 may then display the information via the plurality of LED indicators 202.

Figure 3A:
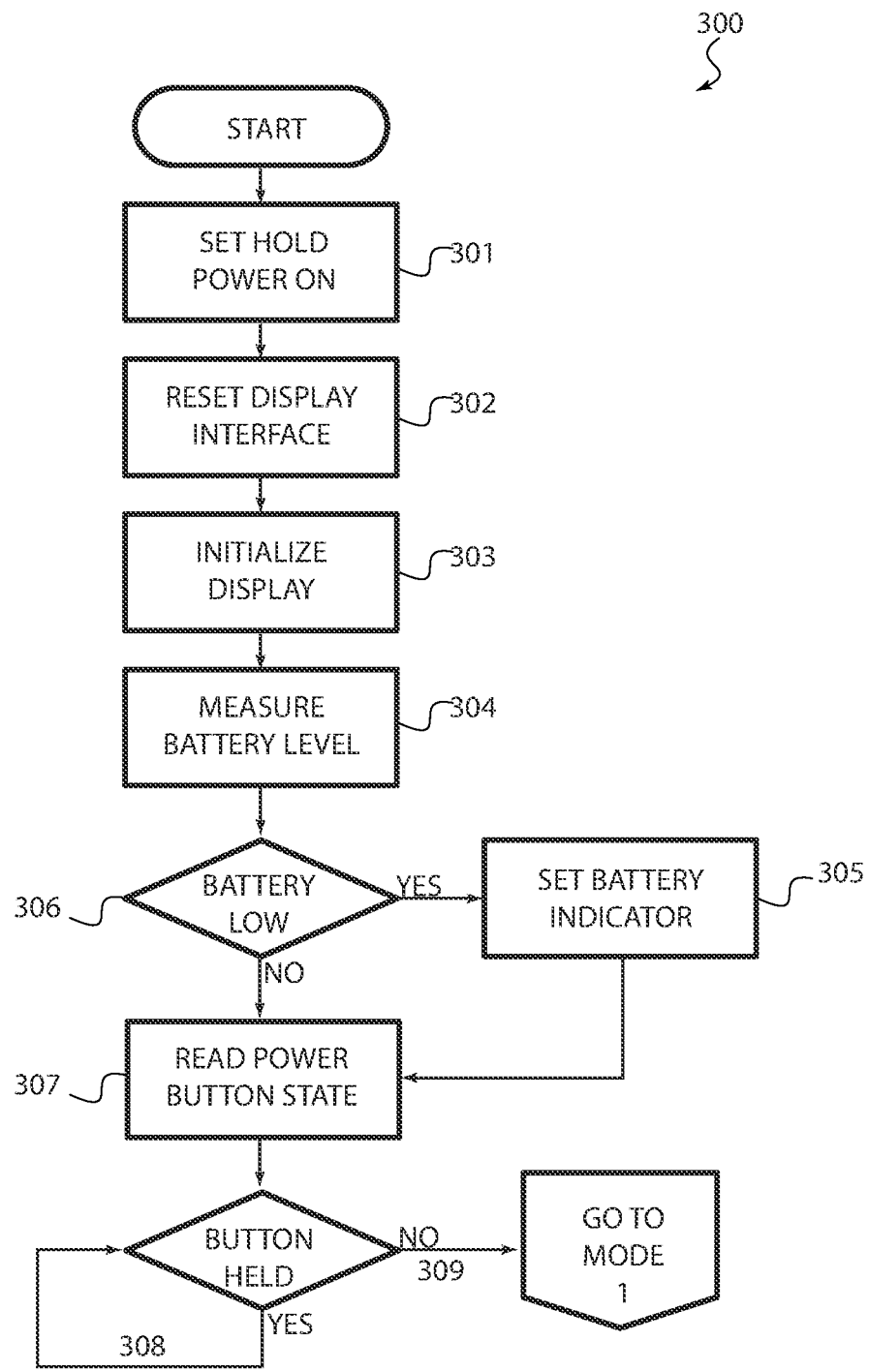
FIG. 3A illustrates a flowchart depicting a power on routine for the meter probe module.

Turning to the next figure, FIG. 3A depicts a flowchart illustrating a meter probe module power on routine 300. In 301, the operator may hold down the on/off button 113. This may allow the power in the battery back 111 to provide power to the microcontroller 109. The microcontroller 109 may then insert a signal that may take the place of the operator holding the on/off button 113. The display interface may then be reset 302, and the display may be initialized 303.

Next, the meter probe module's 100 battery level may be measured to determine if the battery level of the battery pack 111 is sufficient or too low 304. If the battery level is low 305, the battery low LED indicator may be set. After the battery low LED indicator is set, or if the battery is not low 306, the state of the on/off button 113 may be read 307 to determine if the operator is holding the on/off button 113. If the operator is holding the on/off button 113, the meter probe module may maintain itself in a "hold mode" 308 until the on/off button 113 is released. If the on/off button 113 is not being held 309, the meter probe module 100 may go to Mode 1.

Figure 3B:
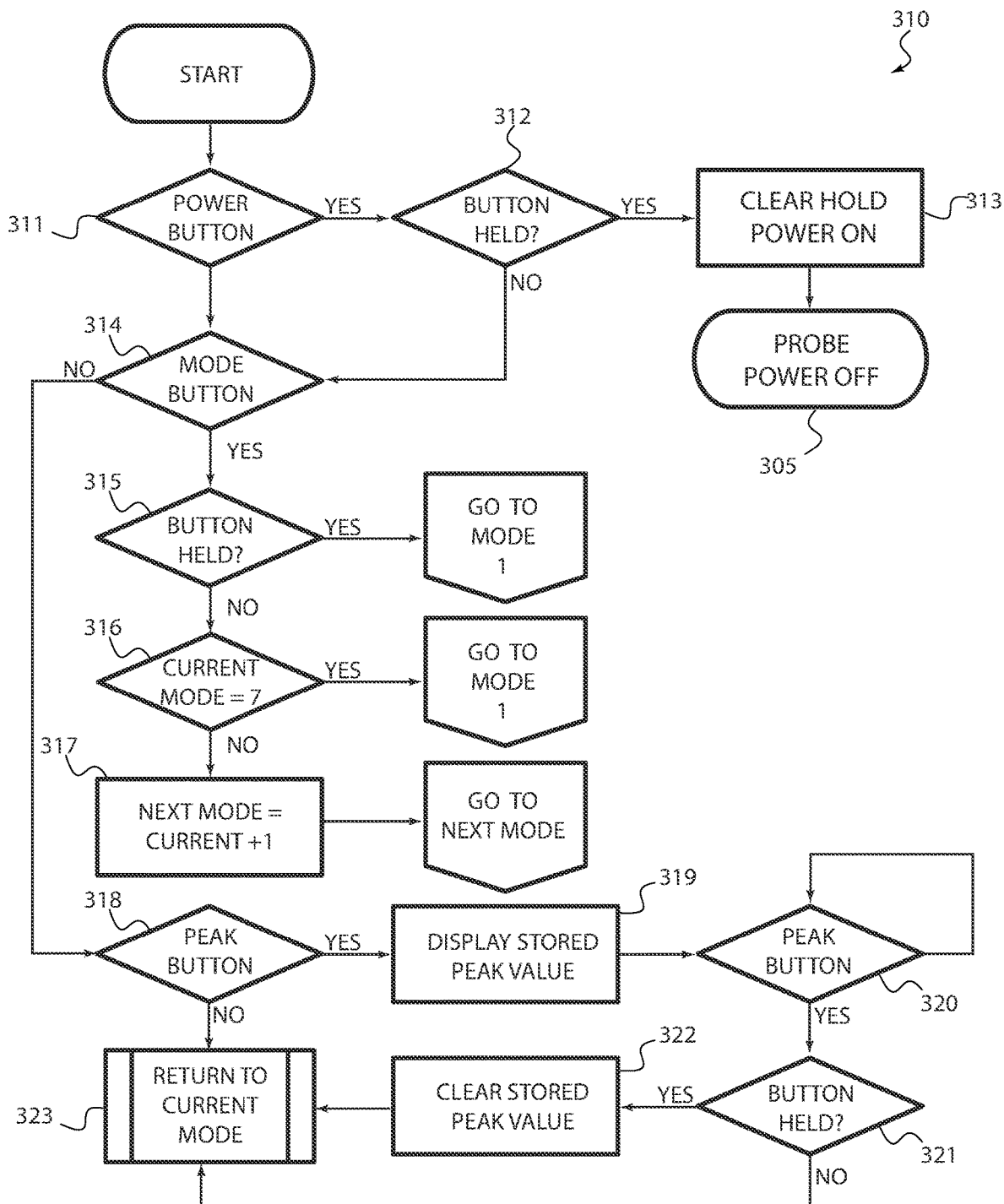
FIG. 3B illustrates a flowchart depicting a button press routine for the meter probe module.

Moving to the next figure, FIG. 3B depicts a flowchart illustrating a meter probe module button press routine 310 to check if the operator pressed a button to change the meter probe module's 100 behavior. In 311, the button press routine 310 may check if the on/off button 113 was pressed. If the on/off button 113 was pressed, the button press routine 310 may check if the on/off button 113 is being held 312. If the on/off button 113 is being held 313, the meter probe module 100 may power off.

If the on/off button 113 was neither pressed nor held, the button press routine 310 may determine if the mode button 114 is being pressed 314. If the mode button 114 is being pressed, the button press routine 310 may determine if the mode button 114 is being held 315. If the mode button 114 is being held, the meter probe module 100 may go to Mode 1. If the mode button 114 is not being held, the button press routine 310 may determine if the meter probe module 100 is currently in Mode 7 316. If the meter probe module 100 is in Mode 7, the meter probe module 100 may go to Mode 1. If the current mode is not Mode 7 317, the meter probe module 100 may proceed to the next numerical mode. By way of example and not limitation, if the meter probe module is currently in Mode 3 and the mode button 114 was pressed but not held, the meter probe module 100 may proceed to Mode 4.

If the mode button 114 is not being pressed, the button press routine 310 may then determine if the peak button 115 is being pressed 318. If the peak button 115 is not being pressed 323, the meter probe module 100 may return to its current mode. If the peak button 115 is being pressed 319, the meter probe module's 100 stored peak value may be displayed. The button press routine 310 may then determine if the peak button 115 is being held 321. If the peak button 115 is not being held 323, the meter probe module 100 may return to its current mode. If the peak button 115 is being held 322, the current peak value measurement may be cleared and the meter probe module 100 may return to its current mode.

Figure 4:
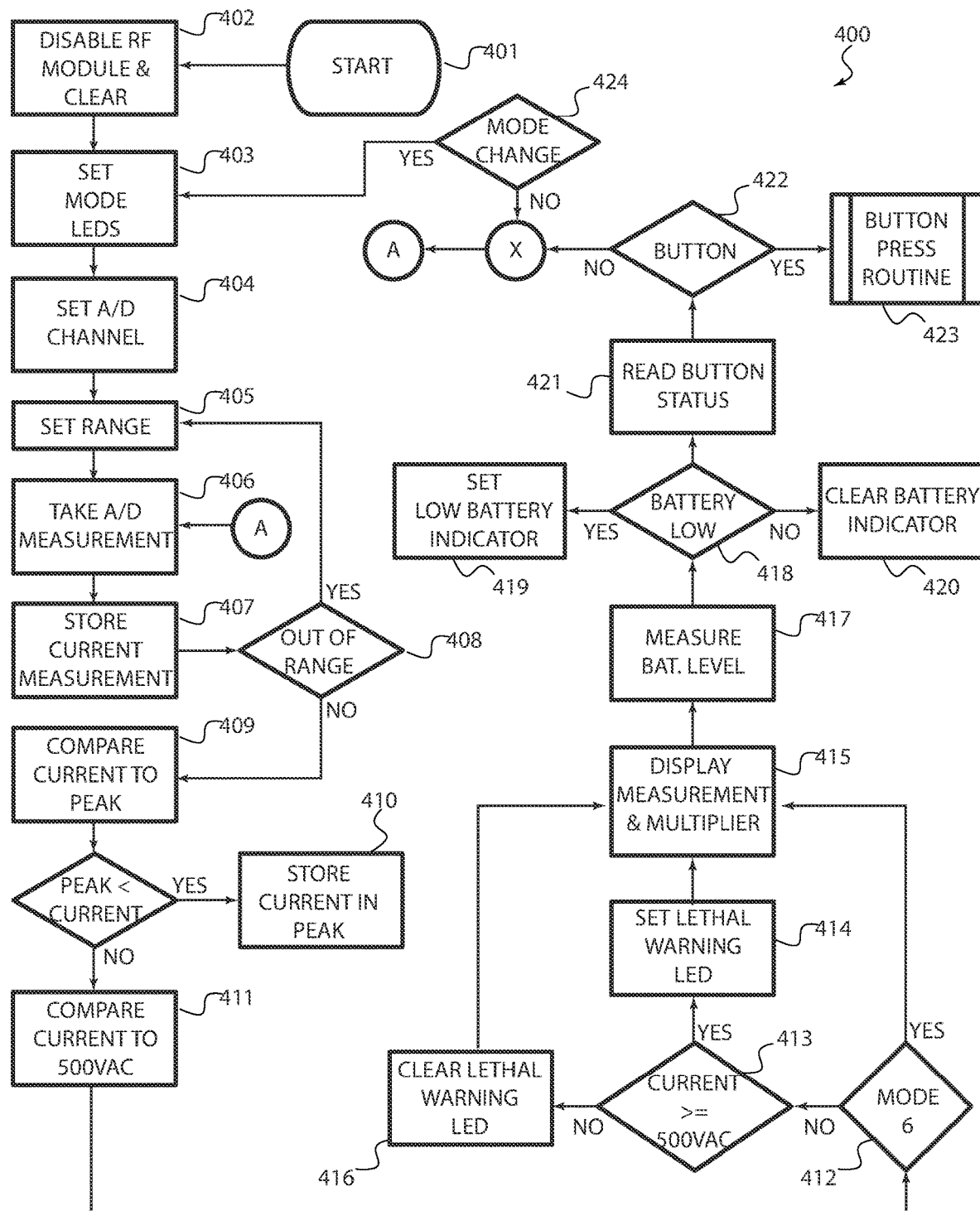
FIG. 4 illustrates a flowchart depicting a mode routine for the meter probe module for several selectable modes of operations in accordance with the present invention.

Turning now to FIG. 4, a flowchart illustrating the meter probe module routine for Modes 1, 3, 5, and 6 is depicted 400. The routine 400 operates when the meter probe module 100 is in Mode 1, 3, 5, or 6 401. If the meter probe module is in Mode 1, 3, 5, or 6, the wireless RF transmitter/receiver 106 may be disabled and the communication LEDs may be cleared 402. The routine 400 may then set the mode LED for the particular mode the meter probe module 100 is currently operating 403. The routine 400 may then set the analog to digital channel 404, set the meter probe module's 100 range 405, take an analog to digital measurement 406, and store the current measurement 407.

The routine 400 may then check if the current measurement is out of range 408. If the current measurement is out of range 405, the routine 400 may set a new range. If the current measurement is in range 409, the current measurement may be compared to a peak measurement.

If the peak measurement is less than the current measurement 410, the stored peak measurement may be replaced with the current measurement. If the current measurement becomes the new peak measurement, or if the peak measurement is greater than the current measurement 411, the current measurement may be compared to 500 volts AC.

If the current measurement is at least 500 volts AC, the routine 400 may check if the meter probe module 100 is in Mode 6 412. If the meter probe module 100 is in Mode 6, the current measurement may be displayed 414. If the meter probe module 100 is not in Mode 6 413, the routine 400 may then check if the current measurement is greater than or equal to 500 volts AC. If the current measurement is greater than or equal to 500 volts AC, the lethal warning LED indicator may be set and the current measurement may be displayed 414. If the current measurement is less than 500 volts AC, the lethal warning LED indicator may be cleared and the current measurement may be displayed 414.

Next, the routine 400 may measure the battery level of the meter probe module 415. If the batter level is low 416, the battery low LED indicator may be set. If the battery level is not low 417, the battery low LED indicator may be cleared.

After determining the meter probe module's 100 battery level, the routine 400 may determine if a button is being pressed 418. If no button was pressed 419, the routine 400 may then take a new A/D measurement 406 and repeat the routine from this point. If a button was pressed 420, the routine 400 may initiate the meter probe module button press routine 310 (See FIG. 3B). After performing the meter probe module button press routine 310, the routine 400 may determine if there has been a mode change 421. If there is not a mode change 422, the routine 400 may proceed to take a new A/D measurement 406 and repeat the routine from this point. If there is a mode change to Mode 1, 3, 5, or 6 423, the appropriate mode LED indicator may be set 403 and the routine may repeat from this point.

Figure 5:
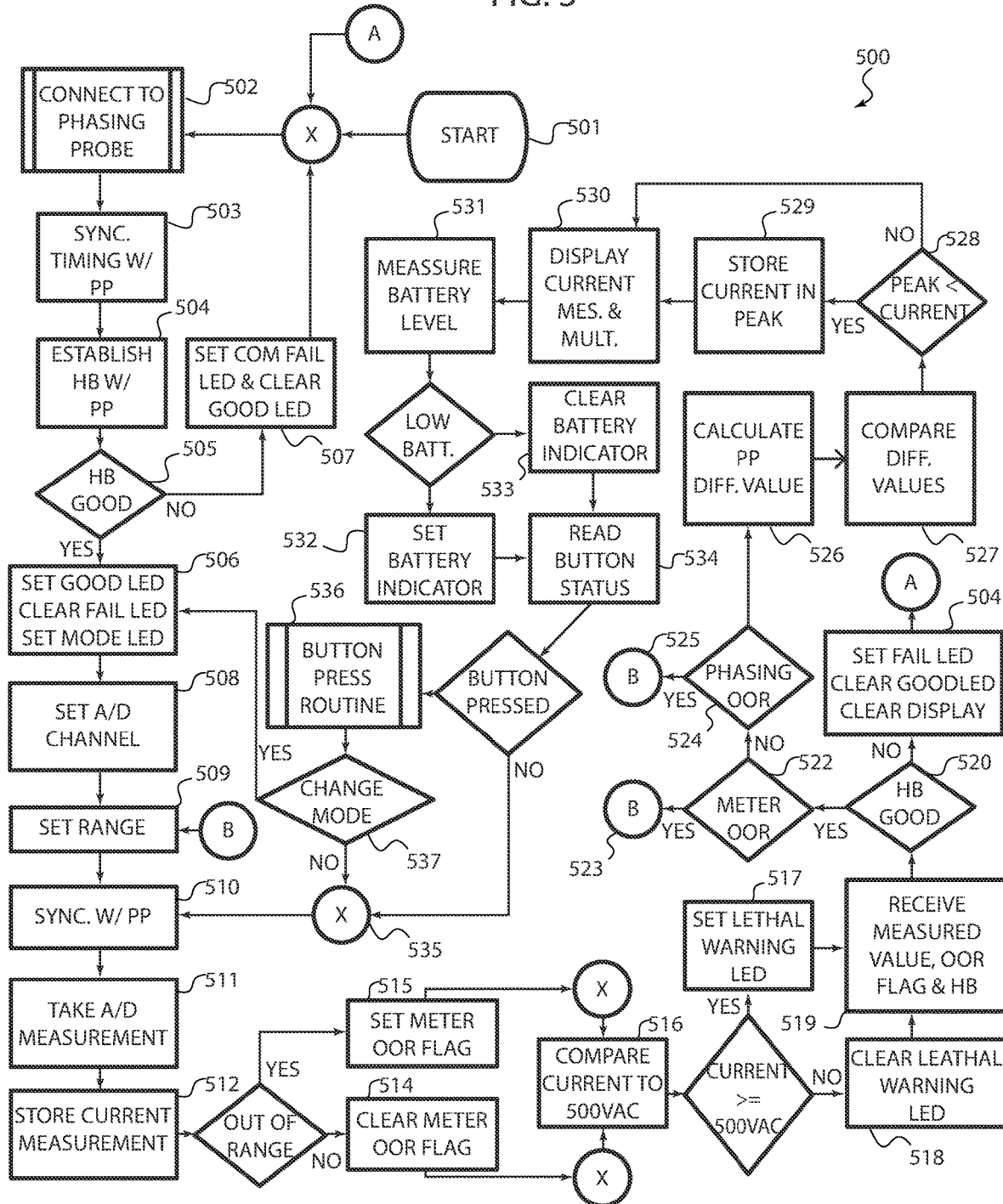
FIG. 5 illustrates a flowchart depicting a mode routine for the meter probe module for several selectable modes of operations in accordance with the present invention.

Turning now to FIG. 5, a flowchart illustrating the meter probe module routine for Modes 2, 4, and 7 is depicted 500. The routine 500 may operate when the meter probe module 100 is in Mode 2, 4, or 7 501. If the meter probe module is in Mode 2, 4, or 7, the routine 500 may initiate the connect to phasing probe module routine 502 (See FIG. 6). The meter probe module 100 and phasing probe module's 200 timings may then be synchronized 503. Next, the routine 500 may establish a heartbeat with the phasing probe module 504. The heartbeat may represent a constant communication of inquiry and acknowledgement between the meter probe module 100 and the phasing probe module 200.

Next, the routine 500 may determine if the heartbeat is healthy 505. If the heartbeat is healthy 506, the communication good LED indicator may be set, the communication fail LED indicator may be cleared, and the mode LED indicator may be set. If the heartbeat is not healthy 507, the communication fail LED indicator may be set, the communication good LED indicator may be cleared, and the routine 500 may reinitiate the connect to phasing probe module routine 502 and proceed from that point.

If the communication good LED indicator is set, the communication fail LED indicator is cleared, and the mode LED indicator is set 506, the routine 500 may set the analog to digital channel 508, set the range 509, synchronize the meter probe module 100 with the phasing probe module 200 510, take an analog to digital measurement 511, and store the current measurement 512.

Next, the routine 500 may determine if the current measurement is out of range 513. If the current measurement is in range, the meter out of range flag indicator may be cleared 514. If the current measurement is out of range, the meter out of range flag indicator may be set 515. After clearing or setting the meter out of range flag indicators, the current measurement may be compared to 500 volts AC which may be relative to earth ground 516.

If the current measurement is greater than or equal to 500 volts AC, the lethal warning LED indicator may be set 517. If the current measurement is less than 500 volts AC, the lethal warning LED indicator may be cleared 518.

After setting or clearing the lethal warning LED indicators, the meter probe module may receive a measured value, time reference, out of range flag, and heartbeat from the phasing probe module 519. From this information, the routine 500 may then determine if the heartbeat is good 520. If the heartbeat is not good 521, the communication fail LED indicator may be set, the communication good LED indicator may be cleared, the display may be cleared, and the routine 500 may then reinitiate the connect to phasing probe module routine 502 and proceed from that point.

If the heartbeat is good, the routine 500 may determine if the meter probe module out of range flag indicator is set 522. If the meter probe module out of range flag indicator is set 523, the routine 500 may set a new range 509 and proceed from that point. If the meter probe module out range flag is not set 524, the routine 500 may determine if the phasing probe module out of range flag indicator is set. If the phasing probe module out of range flag indicator is set 523, the routine 500 may then set a new range 509 and proceed from that point.

If the phasing probe module out of range flag indicator is not set 526, the routine 500 may calculate the meter probe-phasing probe differential value to be displayed and compare the current differential value to the stored peak differential value 527. If the stored peak differential value is greater than the current differential value 528, the current measurement may be displayed 530. If the stored peak differential value is less than the current differential value 529, the current differential value may replace the stored peak differential value and become the new stored peak differential value. Once stored, the current measurement may be displayed 530.

After displaying the current measurement 530, the battery level may be measured 531. If the battery is low 532, the battery low LED indicator may be set. If the battery level is not low 533, the battery low LED indicator may be cleared. After clearing or setting the battery low LED indicator, the routine 500 may determine if a button has been pressed 534.

If a button was not pressed 535, the routine 500 may then synchronize the meter probe module with the phasing probe module 510 and proceed from that point. If a button was pressed 536, the routine may initiate the meter probe module button press routine (See FIG. 3B). After completing the meter probe module button press routine, the routine 500 may determine if there is a mode change 537. If there has not been a mode change 538, the routine 500 may then synchronize the meter probe module with the phasing probe module 510 and proceed from that point. If there has been a mode change 539, the routine 500 may set the communication good LED indicator, clear the communication fail LED indicator, and set the appropriate mode LED 506; the routine 500 may then proceed from that point.

Figure 6:
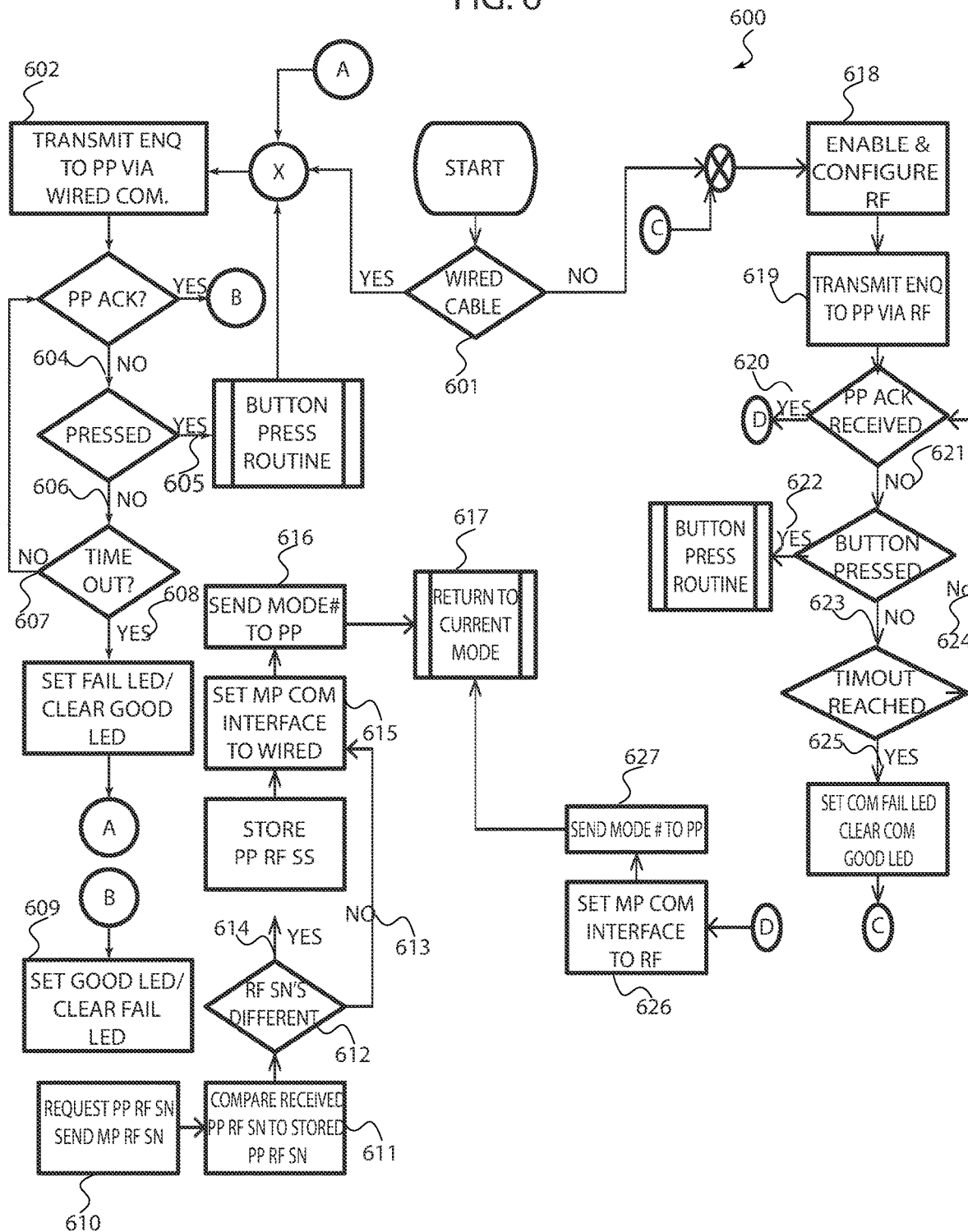
FIG. 6 illustrates a flowcharting depicting a routine for connecting the meter probe module to the phasing probe module.

Turning now to the next figure, FIG. 6 is a flowchart depicting the meter probe module connect to phasing probe module routine 600. The routine 600 may commence by determining if an operator has connected a wired interface cable between the meter probe module and the phasing probe module 601. If the wired interface cable has not been connected, the routine 600 may proceed to 618 as discussed below. If the wired interface cable has been connected, the meter probe module may transmit an inquiry to the phasing probe module via the cable 602. If the phasing probe module acknowledges receipt of the inquiry from the meter probe module 603, the routine 600 may proceed to 609 as discussed below.

If the phasing probe module does not acknowledge receipt of the meter probe module's inquiry 604, the routine 600 may determine if a button is pressed. If a button is pressed, the routine 600 may initiate the meter probe module button press routine 310 (See FIG. 3B) and then proceed to 602. If a button was not pressed 606, the routine 600 may determine if a timeout is reached. If a timeout is not reached 607, the routine 600 may determine if the phasing probe module received an inquiry from the meter probe module 604/605. If a timeout is reached 608, the communication fail LED indicator may be set, the communication good LED indicator may be cleared, and the routine 600 may proceed to 602.

If the phasing probe module acknowledges receipt of the inquiry from the meter probe module 603, the communication good LED indicator is set and the communication fail LED indicator is cleared 609. The routine 600 may then request that the phasing probe module's RF serial number be sent to the meter probe module and that the meter probe module's RF serial number be sent to the phasing probe module 610. The routine 600 may then compare the received phasing probe module RF serial number to a stored phasing prove RF serial number 611, and determine if the phasing probe module RF serial numbers are different 612. If the phasing probe module RF serial numbers are the same 613, the meter probe module's communication interface may be set to wired 615. If the phasing probe module RF serial numbers are different 614, the stored phasing probe module RF serial number may be deleted from the meter probe module's memory, the new phasing probe module RF serial number may be stored in the meter probe module's memory, and the meter probe module's communication interface may be set to wired 615. After the meter probe module's communication interface is set to wired 615, the mode number may be sent to the phasing probe module 616, and the routine 600 returns to the current mode 617.

If the wired interface cable is not connected 601, the wireless RF transmitter/receiver may be enabled and configured 618. Then the routine 600 may transmit an inquiry from the meter probe module to the phasing probe module via the wireless RF transmitter receiver 619. If the phasing probe module receives the inquiry 620, the phasing probe module may acknowledge that it received the inquiry and proceed to 627. If the phasing probe module does not acknowledge receipt of the inquiry 621, the routine 600 may determine if a button is pressed. If a button is being pressed 622, the routine 600 may initiate the meter probe module button press routine 310 (See FIG. 3B) and then proceed to 618. If a button is not being pressed 623, the routine 600 may determine if a timeout is reached. If a timeout is not reached 624, the routine 600 may determine if the phasing probe module has acknowledged receipt of the inquiry 620/621 and proceed from this point. If a timeout is reached 625, the routine 600 may set the communication fail LED indicator, clear the communication good LED indicator, and proceed to 618.

If the phasing probe module acknowledges receipt of the inquiry 620, the routine 600 may set the meter probe module's communication interface to wireless RF transmitter/receiver 626, send the mode number to the phasing probe module 627, and return to the current mode 617.

Figure 7A:
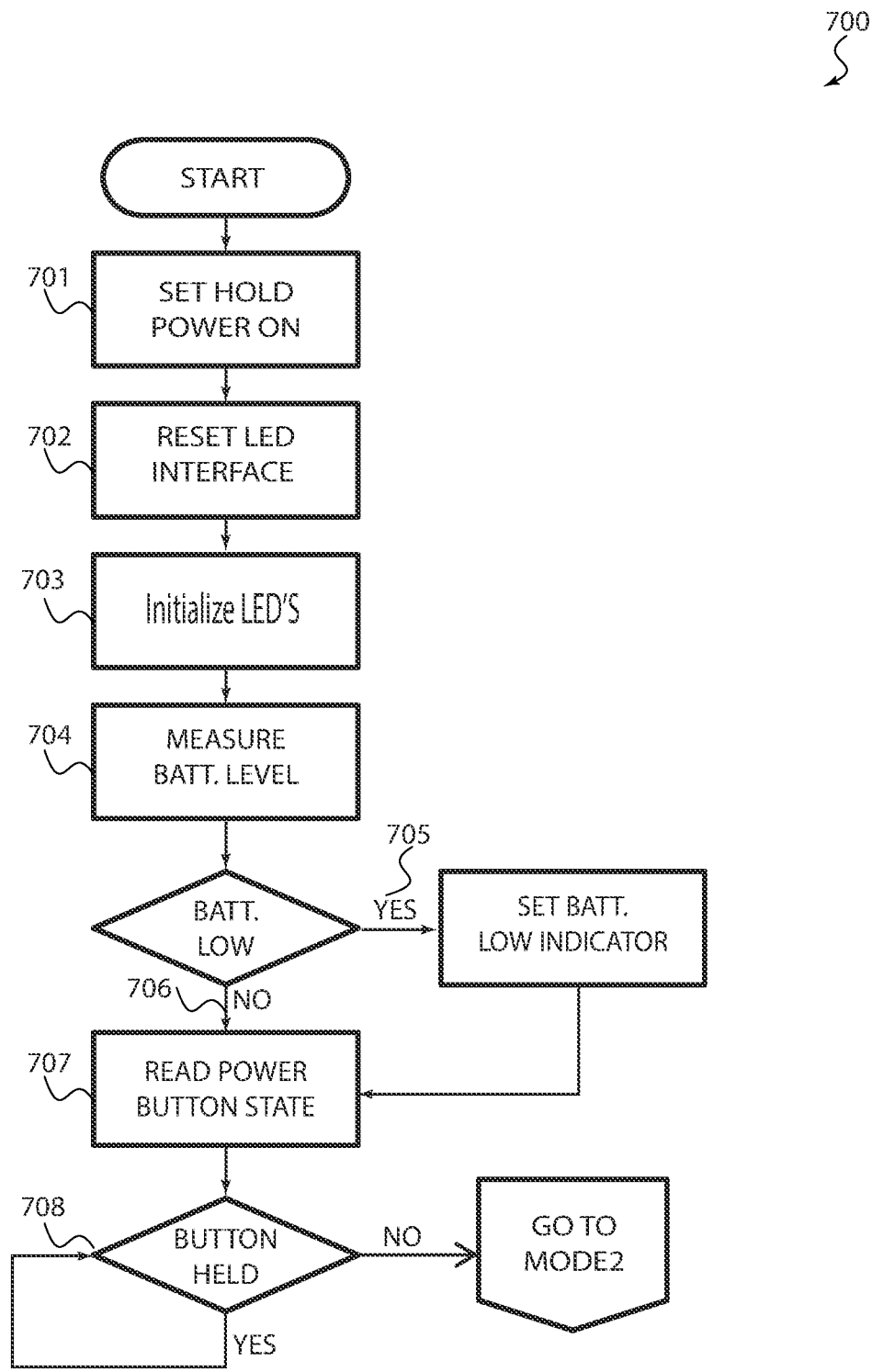
FIG. 7A illustrates a flowchart depicting a power on routine for the phasing probe module.

Turning to the next figure, FIG. 7A depicts a flowchart illustrating a phasing probe module power on routine 700. In 701, the operator may hold down the on/off button 211. This may allow the power in the battery back 209 to provide power to the microcontroller 207. The microcontroller 207 may then insert a signal that may take the place of the operator holding the on/off button 211. The LED interface may then be reset 702 and routine 700 may initialize the LEDs 703.

Next, the phasing probe module's 200 battery level may be measured 704. If the battery level is low 705, the battery low LED indicator may be set. After the battery low LED indicator is set, or if the battery is not low 706, the state of the on/off button 211 may be read 707 to determine if the operator is holding the on/off button 211. If the operator is holding the on/off button 211, the phasing probe module may maintain itself in a "hold mode" 708 until the on/off button 211 is released. If the on/off button 211 is not being held, the phasing probe module 200 may go to Mode 2.

Figure 7B:
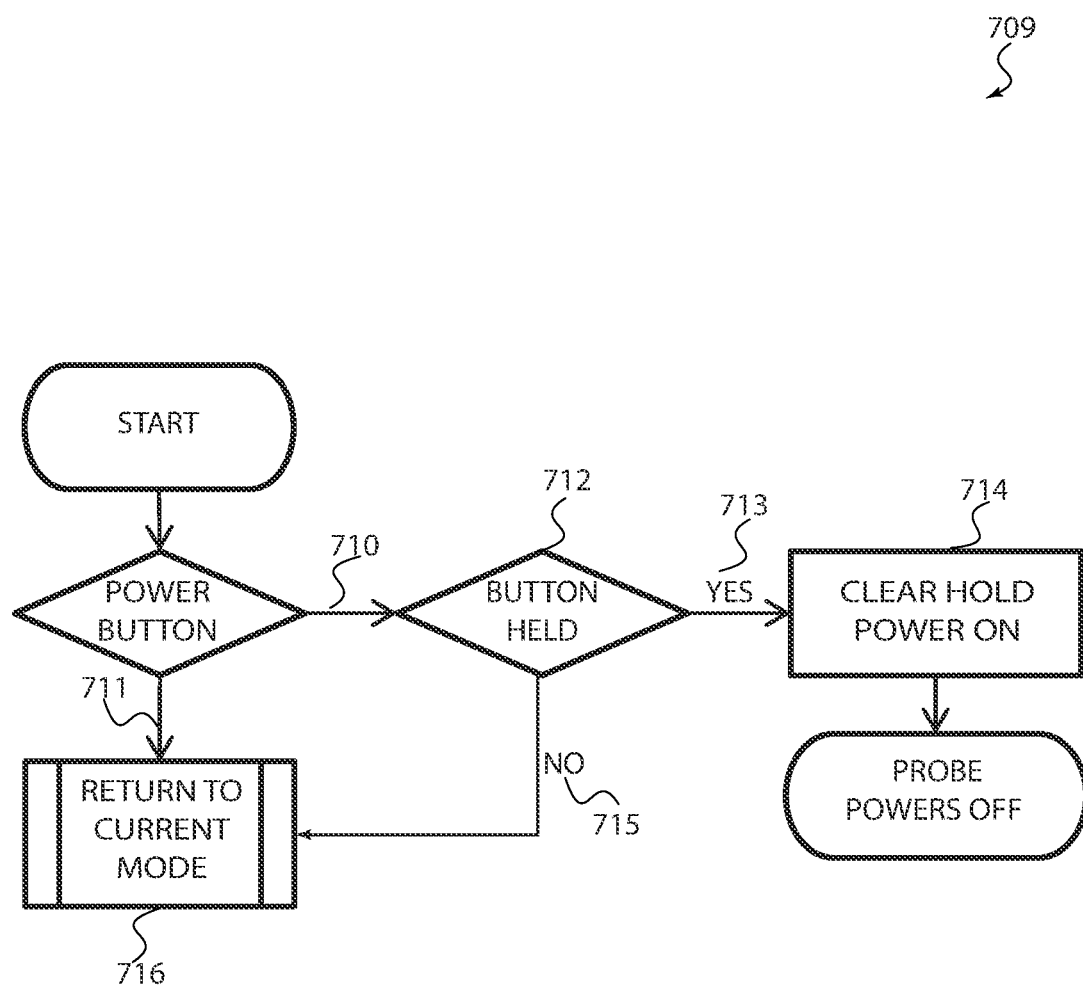
FIG. 7B illustrates a flowchart depicting a button press routine for the phasing probe module.

Moving to the next figure, FIG. 7B depicts a flowchart illustrating a button press routine for the phasing probe module 709 to check if the operator has pressed a button to change the phasing probe module's 200 behavior. The routine 709 may check if the on/off button 211 is being pressed. If the on/off button 211 is being pressed 710, the button press routine 709 may check if the on/off button 211 is being held 712. If the on/off button 211 is being held 713, the hold power on signal may be cleared 714, and the phasing probe module 200 may power off. If the on/off button 211 was neither pressed 711 nor held 715, the button press routine 709 may return to the current mode 716.

Figure 8:
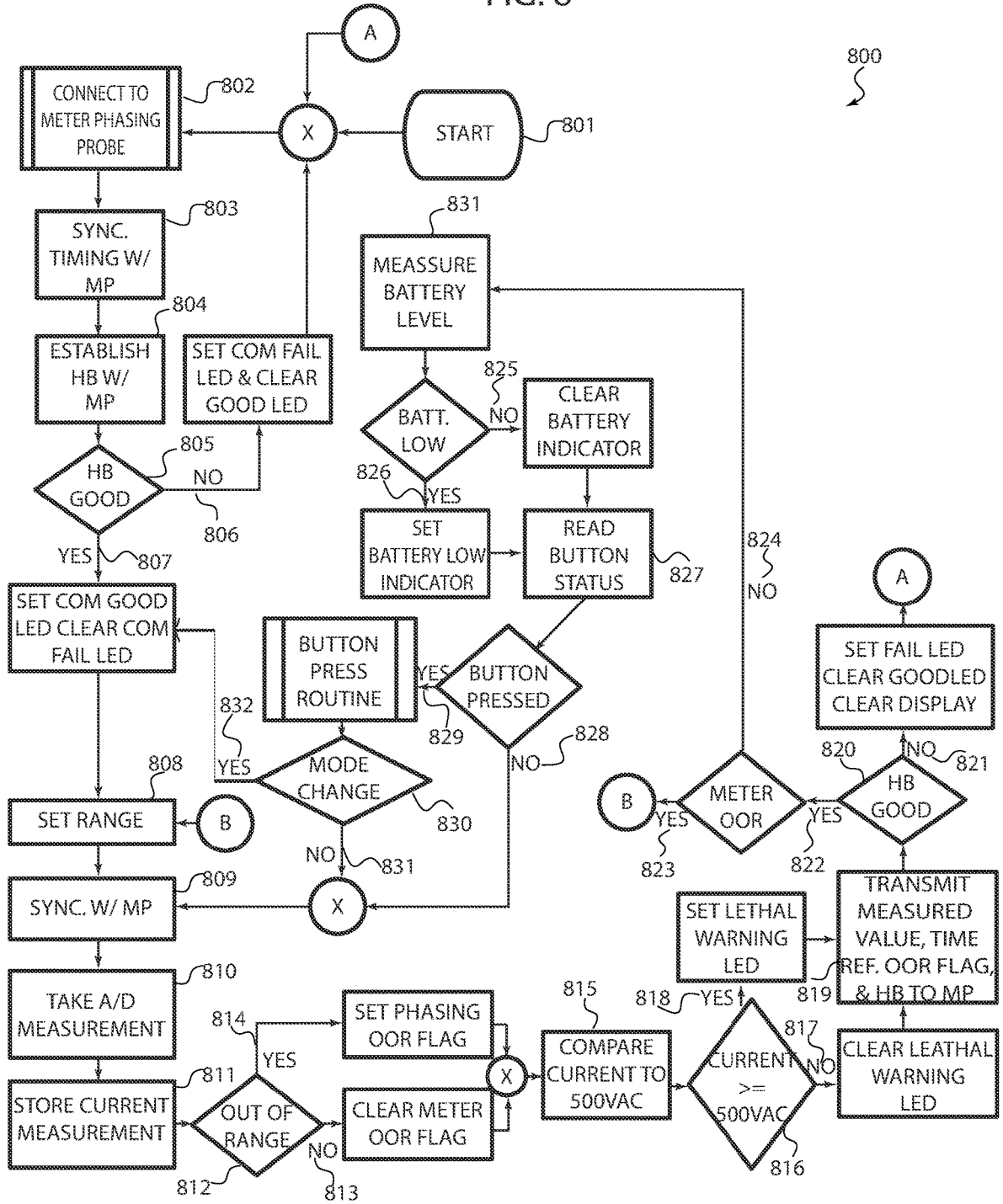
FIG. 8 illustrates a flowchart depicting a mode routine for the phasing probe module for several selectable modes of operation in accordance with the present invention.

Turning now to the next figure, FIG. 8 depicts a flowchart illustrating the phasing probe module routine for Modes 2, 4, and 7 800. The routine 800 may operate when the phasing probe module 200 is in Mode 2, 4, or 7 801. If the meter probe module is in Mode 2, 4, or 7, the routine 800 may initiate the connect to meter probe module routine 802 (See FIG. 9). After the connect to meter probe module routine 802 is finished, the phasing probe module 200 and meter probe module's 100 timings may be synchronized 803. Next, the routine 800 may establish a heartbeat with the meter probe module 804.

After establishing a heartbeat with the meter probe module 804, the routine 800 may determine if the heartbeat is good 805. If the heartbeat is not good 806, the communication fail LED indicator may be set, the communication good LED indicator may be cleared, and the routine 800 may proceed to 802. If the heartbeat is good 807, the communication good LED indicator may be set and the communication fail LED indicator may be cleared.

The routine 800 may then set a range 808, synchronize the phasing probe module with the meter probe module 809, take an analog to digital measurement 810, and store the current measurement 811. The routine 800 may then determine if the current measurement is out of range 812. If the current measurement is not out of range 813, the phasing out of range flag indicator may be cleared. If the current measurement is out of range 814, the phasing out of range flag may be set. After the phasing out of range flag is set or cleared, the current measurement may be compared to 500 volts AC 815.

After comparing the current measurement to 500 volts AC, the routine 800 may determine if the current measurement is greater than or equal to 500 volts AC 816. If the current measurement is less than 500 volts AC 817, the lethal warning LED indicator may be cleared. If the current measurement is greater than or equal to 500 volts AC 818, the lethal warning LED indicator may be set. After the lethal warning LED indicator has been set or cleared, the measured value, time reference, out of range flag, and heartbeat may be transmitted to the meter probe module 819.

The routine 800 may then determine if the heartbeat is good 820. If the heartbeat is not good 821, the communication fail LED indicator may be set, the communication good LED indicator may cleared, and the routine 800 may proceed to 802.

If the heartbeat is good 822, the routine 800 may determine if the status of the phasing probe module out of range flag indicator. If the phasing probe module out of range flag indicator is set 823, the routine may proceed to 808. If the phasing probe module out of range flag indicator is cleared 824, the routine may measure the battery level. If the battery level is not low 825, the battery low LED indicator may be cleared. If the batter level is low 826, the battery low LED indicator may be set.

After setting or clearing the battery low LED indicator, the routine 800 may determine if a button is being pressed 827. If a button is not being pressed 828, the routine 800 may proceed to 809. If a button is being pressed 829, the phasing probe module button press routine 709 may be initiated (See FIG. 7B). After the phasing probe module button press routine 709 is complete, the routine may determine if there has been a mode change 830. If there has not been a mode change 831, the routine 800 may proceed to and continue from 809. If there has been a button change 832, the routine 800 may proceed to and continue from 807.

Figure 9:
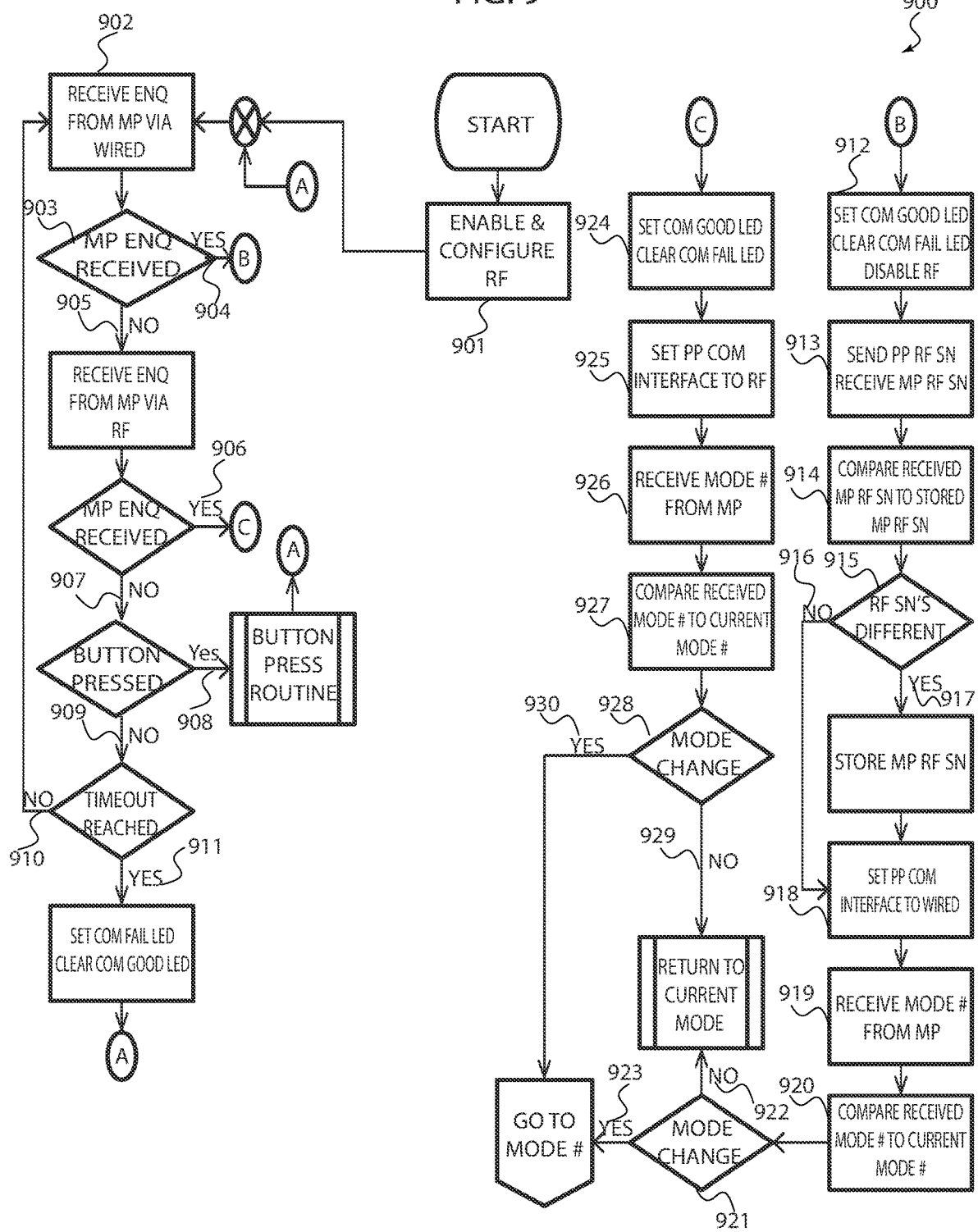
FIG. 9 illustrates a flowchart depicting a routine for connecting the phasing probe module to the meter probe module.

Turning now to FIG. 9, a flowchart illustrating the phasing probe module connect to meter probe module routine 900 is depicted. The routine 900 may commence by enabling and configuring the wireless RF transmitter/receiver 901. The phasing probe module may then receive an inquiry from the meter probe module via a wired interface cable 902. The routine 900 may then determine if the phasing probe module received an inquiry from the meter probe module via a wired interface cable 903. If the meter probe module's inquiry has been received via the cable 904, the routine 900 may proceed to 912. If the meter probe module's inquiry is not received 905, the routine 900 may determine if the phasing probe module has received an inquiry from the meter probe module via the wireless RF transmitter/receiver. If the meter probe module's inquiry has been received via the wireless RF transmitter/receiver 906, the routine 900 may proceed to 924. If the meter probe module's inquiry is not received via the wireless RF transmitter/receiver 907, the routine 900 may determine if a button is being pressed. If a button is being pressed 908, the phasing probe module button press routine 709 may be initiated (See FIG. 7B), and the routine 900 may proceed to 902. If a button is not being pressed 909, the routine 900 may determine if a timeout has been reached. If a timeout has not been reached 910, the routine 900 may proceed to 902. If a timeout has been reached 911, the communication fail LED indicator may be set, the communication good LED indicator may be cleared, and the routine 900 may proceed to 902.

If the meter probe module's inquiry is received via the wire 904, the routine 900 may set the communication good LED indicator, clear the communication fail LED indicator, and disable the wireless RF transmitter/receiver 912.

The routine 900 may then send the phasing probe module's RF serial number and receive the meter probe module's RF serial number 913. The routine 900 may then compare the received meter probe module RF serial number to a stored meter probe module RF serial number 914. It may then be determined if the received and stored meter probe module RF serial numbers are different 915. If the received and stored meter probe module RF serial numbers are the same 916, the phasing probe module communication interface may be set to wired 918. If the received and stored meter probe module RF serial numbers are different 917, the received meter probe module RF serial number may replace the stored meter probe module RF serial number and become the new stored meter probe module RF serial number. The routine 900 may then set the phasing probe module communication interface to wired 918.

The routine 900 may then receive the mode number from the meter probe module 919, compare the received mode number to the current mode number 920, and determine if there is a mode change 921. If there is not a mode change 922, the routine 900 may return to the current mode. If there is a mode change 923, the routine 900 may go to the new mode number.

If the meter probe module's inquiry is received wirelessly 906, the routine 900 may set the communication good LED indicator and clear the communication fail LED indicator 924. The routine 900 may then set the phasing probe module communication interface to wireless RF transmitter receiver 925.

The mode number may then be received from the meter probe module 926 which may be compared to the current mode number 927. The routine 900 may then determine if there is a mode change 928. If there is not a mode change 929, the routine 900 may return to the current mode. If there is a mode change 930, the routine 900 may go to the new mode number.

A multimeter with a meter probe module and phasing probe module capable of wireless communication and taking measurements proximally without direct contact has been described. The foregoing description of the various exemplary embodiments of the invention has been presented for the purposes of illustration and disclosure. It is not intended to be exhaustive or to limit the invention to the precise form disclosed. Many modifications and variations are possible in light of the above teaching without departing from the spirit of the invention.

What is claimed is:

1. A multimeter capable of direct contact and non-contact proximity measurements of electrical quantities, comprising:
    a meter probe module configured to execute a mode selected from the group consisting of: a voltage, single probe, direct contact mode; a phasing voltage, direct contact mode; a voltage, single probe, capacitive mode; a phasing voltage, capacitive mode; a voltage, single probe, non-contact mode; a current, single probe non-contact mode; and a phasing degree, direct contact mode, the meter probe module comprising:
        a wired communication interface configured to establish an exclusive communication protocol with a phasing probe module;
        a wireless communication interface configured to wirelessly facilitate the exclusive communication protocol with the phasing probe module;
        a first measurement point configured for direct contact measurements of electrical quantities and to generate a first electrical signal indicative of a first electrical quantity;
        a second measurement point configured for non-contact proximity measurements of electrical quantities and to generate a second electrical signal indicative of a second electrical quantity, and
        a range select module configured to provide measurement of electrical quantities in an appropriate range;
    wherein the phasing probe module, comprises:
        a wired communication interface configured to establish an exclusive communication protocol with the meter probe module;
        a wireless communication interface configured to wirelessly facilitate the exclusive communication protocol with the meter probe module;
        a third measurement point configured for direct contact measurements of electrical quantities, generate a third electrical signal indicative of an electrical quantity, and
        a range select module configured to provide measurement of electrical quantities in an appropriate range,
    a second microcontroller within the phasing probe module, configured to:
        receive the third electrical signal of the third measurement point and determine an electrical parameter;
        automatically determine an appropriate range of measurement of the electrical parameter, and
        send the measurement of the electrical parameter in the determined range to the meter probe module, wherein the electrical parameter is selected from the group consisting of a voltage measurement; a current measurement; and a phase measurement, and
    a first microcontroller within the meter probe module, configured to:
        receive the first electrical signal and determine a first electrical parameter;
        receive the second electrical signal and determine a second electrical parameter, wherein the first and second electrical parameters is selected from the group consisting of a voltage measurement; a current measurement; and a phase measurement;
        automatically determine an appropriate range of measurement of the first electrical parameter and the second electrical parameter;
        determine peak measurement of the electrical parameter; and
        receive the third electrical signal from the phasing probe module and determine a differential measurement, wherein the differential measurement is selected from the group consisting of: a voltage differential; a current differential; and a phase differential.

2. The multimeter of claim 1, wherein the first measurement point of the meter probe module comprises a resistor configured for direct contact measurements of electrical quantities.

3. The multimeter of claim 1, wherein the second measurement point of the meter probe module comprises a resistor configured for non-contact proximity measurements of electrical quantities.

4. The multimeter of claim 1, wherein the third measurement point of the phasing probe module comprises a resistor configured for direct contact measurements of electrical quantities.

5. The multimeter of claim 1, wherein the meter probe module further includes an LED indicator coupled to a display controller for displaying a visual output associated with the first electrical parameter, the second electrical parameter, or the differential measurement.

6. The multimeter of claim 5, wherein the LED indicator coupled to the display controller configured for displaying output corresponding to a health of connectivity between the meter probe module and the phasing probe module.

7. The multimeter of claim 1, wherein the meter probe module further includes an audio signalling device coupled to the display controller for displaying an audio output associated with the first electrical parameter, the second electrical parameter, or the differential measurement.

8. The multimeter of claim 1, wherein the meter probe module further includes a display coupled to the display controller for displaying an alphanumeric output associated with the first electrical parameter.

9. The multimeter of claim 1, wherein the phasing probe module further includes an LED indicator coupled to a display controller of the phasing probe module for displaying a visual output associated with the electrical parameter.

10. The multimeter of claim 1, wherein the meter probe module comprises one or more buttons comprising a peak button, the peak button is configured to control display of peak measurement of the electrical parameter.

11. The multimeter of claim 1, wherein the first microcontroller is configured to check if the measurement of the electrical parameter is out of range, and automatically set a new range of measurement when the measurement of the electrical parameter is out of range.

12. The multimeter of claim 1, wherein the second microcontroller is configured to check if the measurement of the electrical parameter is out of range, and automatically set a new range of measurement when the measurement of the electrical parameter is out of range.

13. The multimeter of claim 1, wherein the display controller of the meter probe module is configured to provide warning when the measurement of the electrical parameter is higher than a predefined range of the electrical parameter.

14. The multimeter of claim 1, further comprising: at least one battery pack for supplying power to the first microcontrollers, and at least one battery pack for supplying power to the second microcontroller.

15. The multimeter of claim 14, wherein the display controller of the phasing probe module coupled to the first microcontroller is configured to display status of the battery level of the battery pack.

16. The multimeter of claim 14, wherein the display controller of the meter probe module coupled to the second microcontroller is configured to display status of the battery level of the battery pack.

17. The multimeter of claim 1, wherein the first and second wired communication interfaces comprise of wired duplex drivers and receivers configured to communicate via cable connecting the first wired communication interface to the second wired communication interface.

\* \* \* \* \*